(12) United States Patent
Chou et al.

(10) Patent No.: US 9,006,080 B2
(45) Date of Patent: Apr. 14, 2015

(54) VARIED STI LINERS FOR ISOLATION STRUCTURES IN IMAGE SENSING DEVICES

(71) Applicant: Taiwan Semiconductor Manufacturing Company, Ltd., Hsin-Chu (TW)

(72) Inventors: Cheng-Hsien Chou, Tainan (TW); Min-Feng Kao, Chiayi (TW); Feng-Chi Hung, Chu-Bei (TW); Shih Pei Chou, Tainan (TW); Jiech-Fun Lu, Madou Township, Tainan County (TW); Yeur-Luen Tu, Taichung (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/797,464

(22) Filed: Mar. 12, 2013

(65) Prior Publication Data

US 2014/0264719 A1   Sep. 18, 2014

(51) Int. Cl.
*H01L 21/762* (2006.01)
*H01L 29/06* (2006.01)
*H01L 27/146* (2006.01)

(52) U.S. Cl.
CPC ...... *H01L 21/76229* (2013.01); *H01L 27/1464* (2013.01); *H01L 27/14689* (2013.01); *H01L 29/0649* (2013.01); *H01L 21/76237* (2013.01); *H01L 27/14621* (2013.01); *H01L 27/14627* (2013.01); *H01L 27/1463* (2013.01)

(58) Field of Classification Search
CPC ............... H01L 21/76229; H01L 21/76237; H01L 27/1464; H01L 27/14689; H01L 29/0649

USPC ............ 438/424, 427, 437; 257/510, 519, 257/E21.546, E21.551
See application file for complete search history.

(56) References Cited

U.S. PATENT DOCUMENTS

| | | | | |
|---|---|---|---|---|
| 5,175,122 A | * | 12/1992 | Wang et al. | 438/427 |
| 5,189,501 A | * | 2/1993 | Kawamura et al. | 257/647 |
| 5,244,827 A | * | 9/1993 | Dixit et al. | 438/431 |
| 5,702,976 A | * | 12/1997 | Schuegraf et al. | 438/424 |
| 5,801,082 A | * | 9/1998 | Tseng | 438/424 |
| 5,960,298 A | * | 9/1999 | Kim | 438/424 |
| 6,323,054 B1 | * | 11/2001 | Yaung et al. | 438/75 |
| 6,323,106 B1 | * | 11/2001 | Huang et al. | 438/433 |
| 6,342,429 B1 | * | 1/2002 | Puchner et al. | 438/424 |
| 6,476,445 B1 | * | 11/2002 | Brown et al. | 257/347 |
| 6,486,039 B2 | * | 11/2002 | Yoo et al. | 438/425 |
| 6,486,517 B2 | * | 11/2002 | Park | 257/374 |

(Continued)

*Primary Examiner* — Mary Wilczewski
(74) *Attorney, Agent, or Firm* — Haynes and Boone, LLP

(57) ABSTRACT

An integrated circuit device incorporating a plurality of isolation trench structures configured for disparate applications and a method of forming the integrated circuit are disclosed. In an exemplary embodiment, a substrate having a first region and a second region is received. A first isolation trench is formed in the first region, and a second isolation trench is formed in the second region. A first liner layer is formed in the first isolation trench, and a second liner layer is formed in the second isolation trench. The second liner layer has a physical characteristic that is different from a corresponding physical characteristic of the first liner layer. An implantation procedure is performed on the second isolation trench and the second liner layer formed therein. The physical characteristic of the second liner layer may be selected to enhance an implantation depth or an implantation uniformity compared to the first liner layer.

20 Claims, 17 Drawing Sheets

(56) References Cited

U.S. PATENT DOCUMENTS

| | | | |
|---|---|---|---|
| 6,521,493 B1 * | 2/2003 | Alsmeier et al. | 438/199 |
| 6,613,647 B2 * | 9/2003 | Kim | 438/424 |
| 6,642,087 B2 * | 11/2003 | Nozaki et al. | 438/149 |
| 6,670,689 B2 * | 12/2003 | Oh et al. | 257/506 |
| 6,774,017 B2 * | 8/2004 | Brown et al. | 438/480 |
| 6,808,944 B1 * | 10/2004 | Jin et al. | 438/14 |
| 6,844,239 B2 * | 1/2005 | Lee | 438/433 |
| 7,060,960 B2 * | 6/2006 | Ohta et al. | 250/214.1 |
| 7,078,286 B1 * | 7/2006 | Mehta | 438/221 |
| 7,122,443 B2 * | 10/2006 | Yang | 438/437 |
| 7,229,896 B2 * | 6/2007 | Chen et al. | 438/435 |
| 7,338,850 B2 * | 3/2008 | Lee | 438/221 |
| 7,338,880 B2 * | 3/2008 | Lim | 438/433 |
| 7,358,150 B2 * | 4/2008 | Hempel et al. | 438/435 |
| 7,378,630 B2 * | 5/2008 | Yoshida | 250/205 |
| 7,468,302 B2 * | 12/2008 | Shin | 438/296 |
| 7,482,246 B2 * | 1/2009 | Eun | 438/437 |
| 7,585,707 B2 * | 9/2009 | Mouli | 438/144 |
| 7,586,170 B2 * | 9/2009 | Kwon et al. | 257/446 |
| 7,608,870 B2 * | 10/2009 | Cole et al. | 257/290 |
| 7,662,657 B2 * | 2/2010 | Mouli | 438/57 |
| 7,727,856 B2 * | 6/2010 | Teo et al. | 438/434 |
| 7,767,528 B2 * | 8/2010 | Muller et al. | 438/270 |
| 7,768,047 B2 * | 8/2010 | Mauritzson et al. | 257/292 |
| 7,858,492 B2 * | 12/2010 | Hong et al. | 438/435 |
| 8,193,067 B2 * | 6/2012 | Anderson et al. | 438/391 |
| 8,198,171 B2 * | 6/2012 | Kim | 438/427 |
| 8,378,398 B2 * | 2/2013 | Doan et al. | 257/292 |
| 8,384,188 B2 * | 2/2013 | Kim | 257/506 |
| 8,399,363 B1 * | 3/2013 | Lee et al. | 438/761 |
| 8,440,495 B2 * | 5/2013 | Liu et al. | 438/73 |
| 8,492,820 B2 * | 7/2013 | Anderson et al. | 257/301 |
| 2001/0025970 A1 * | 10/2001 | Nozaki et al. | 257/255 |
| 2002/0070430 A1 * | 6/2002 | Oh et al. | 257/622 |
| 2002/0076900 A1 * | 6/2002 | Park et al. | 438/424 |
| 2004/0164227 A1 * | 8/2004 | Ohta et al. | 250/208.1 |
| 2004/0212035 A1 * | 10/2004 | Yeo et al. | 257/510 |
| 2006/0003541 A1 * | 1/2006 | Choi et al. | 438/424 |
| 2006/0006439 A1 * | 1/2006 | Ju et al. | 257/295 |
| 2006/0033129 A1 * | 2/2006 | Mouli | 257/291 |
| 2007/0096176 A1 * | 5/2007 | Mouli | 257/291 |
| 2007/0141801 A1 * | 6/2007 | Kwon et al. | 438/400 |
| 2007/0200196 A1 * | 8/2007 | Kumar et al. | 257/506 |
| 2007/0267715 A1 * | 11/2007 | Mehta et al. | 257/510 |
| 2008/0035963 A1 * | 2/2008 | Kwon et al. | 257/291 |
| 2008/0150037 A1 * | 6/2008 | Teo et al. | 257/374 |
| 2009/0140375 A1 * | 6/2009 | Kim | 257/506 |
| 2011/0037115 A1 * | 2/2011 | Kim et al. | 257/316 |
| 2011/0101488 A1 * | 5/2011 | Kim | 257/506 |
| 2012/0009714 A1 * | 1/2012 | Mouli | 438/57 |
| 2012/0025199 A1 * | 2/2012 | Chen et al. | 257/75 |
| 2012/0034757 A1 * | 2/2012 | Choi et al. | 438/437 |
| 2012/0080733 A1 * | 4/2012 | Doan et al. | 257/292 |
| 2012/0122303 A1 * | 5/2012 | Parries et al. | 438/479 |
| 2013/0105870 A1 * | 5/2013 | Tateshita | 257/292 |
| 2013/0134520 A1 * | 5/2013 | Maeda et al. | 257/368 |
| 2013/0217173 A1 * | 8/2013 | Chen et al. | 438/73 |
| 2013/0249048 A1 * | 9/2013 | Kim et al. | 257/506 |
| 2014/0017875 A1 * | 1/2014 | Yaegashi et al. | 438/437 |
| 2014/0127879 A1 * | 5/2014 | Peng et al. | 438/437 |

\* cited by examiner

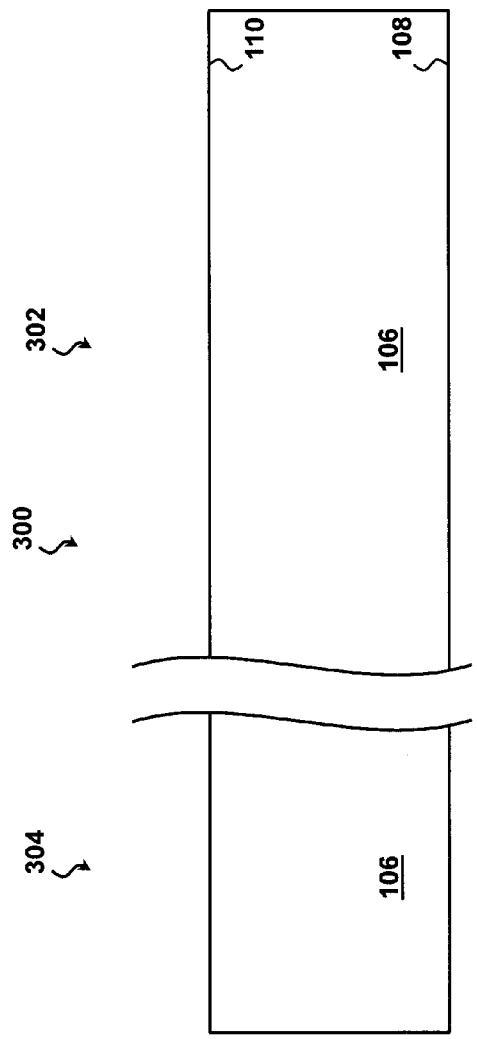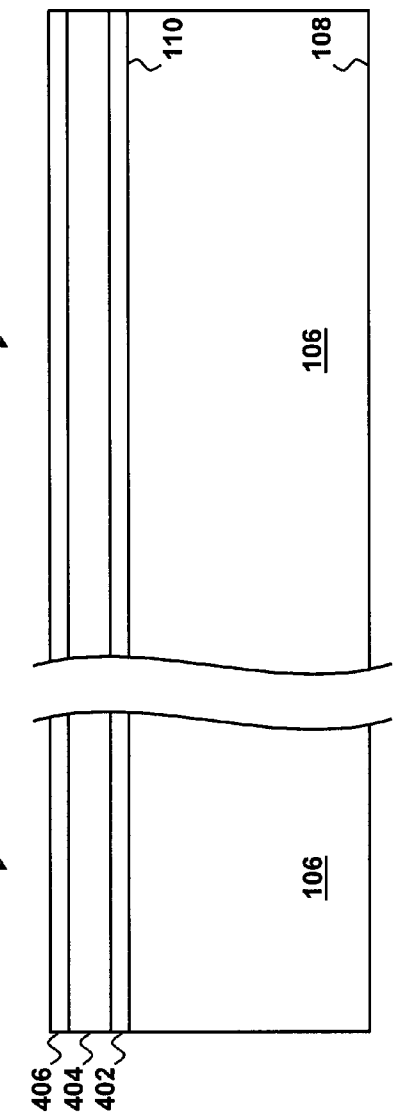

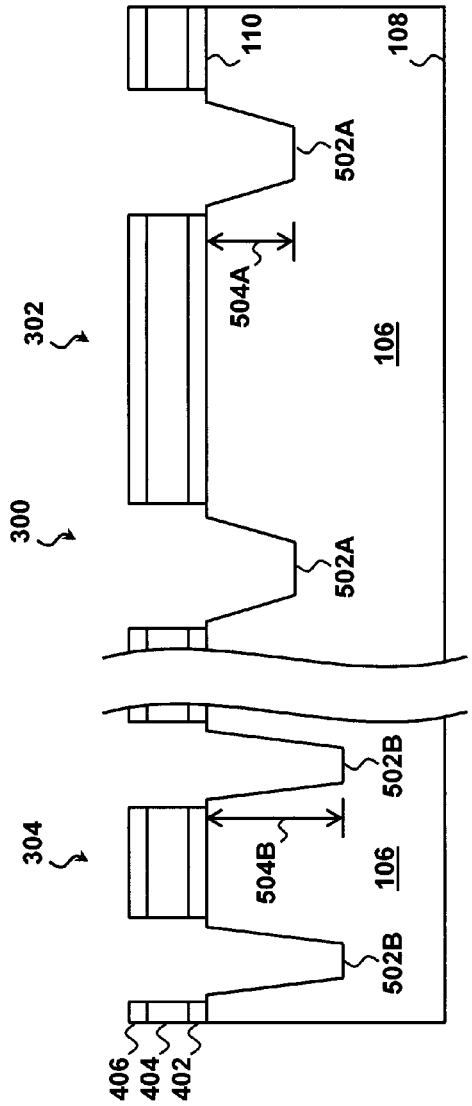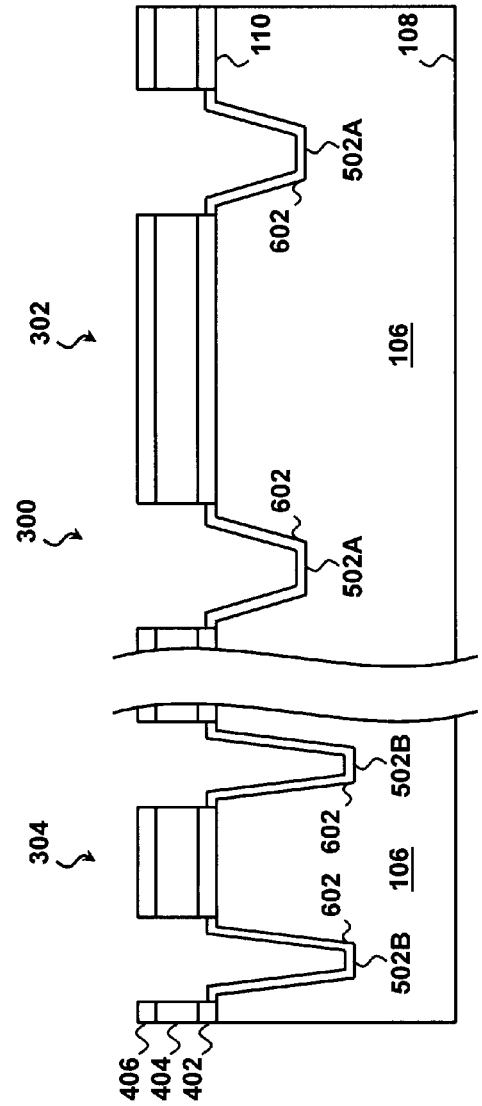

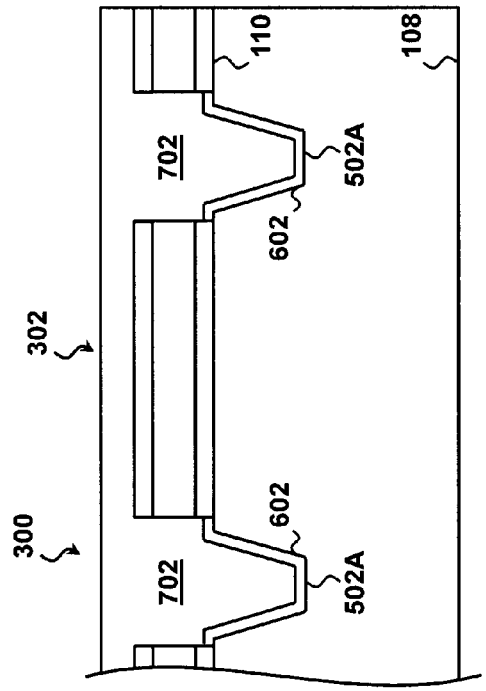
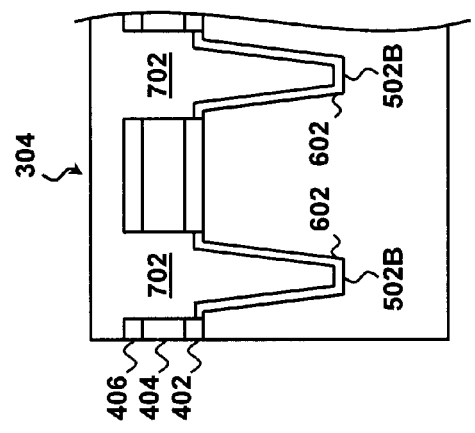
Fig. 7
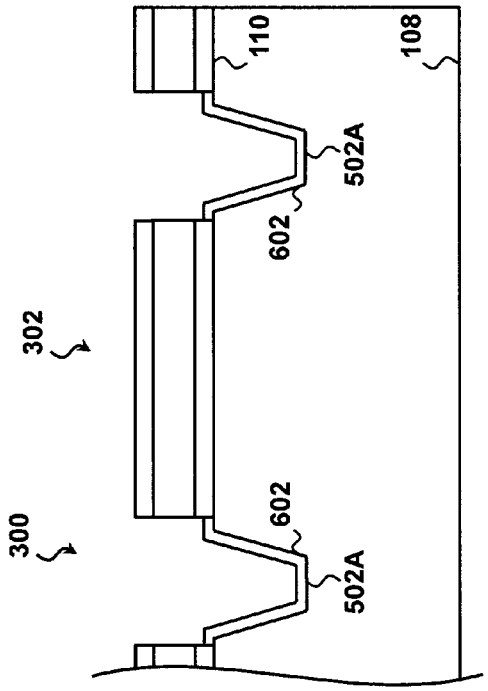
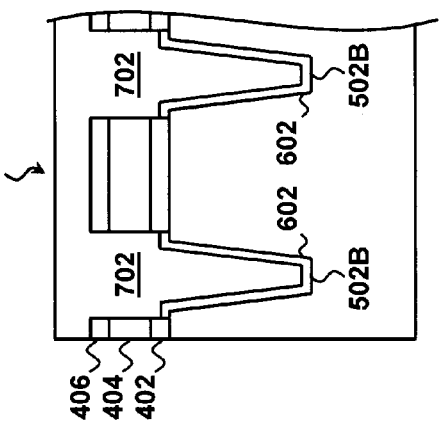
Fig. 8

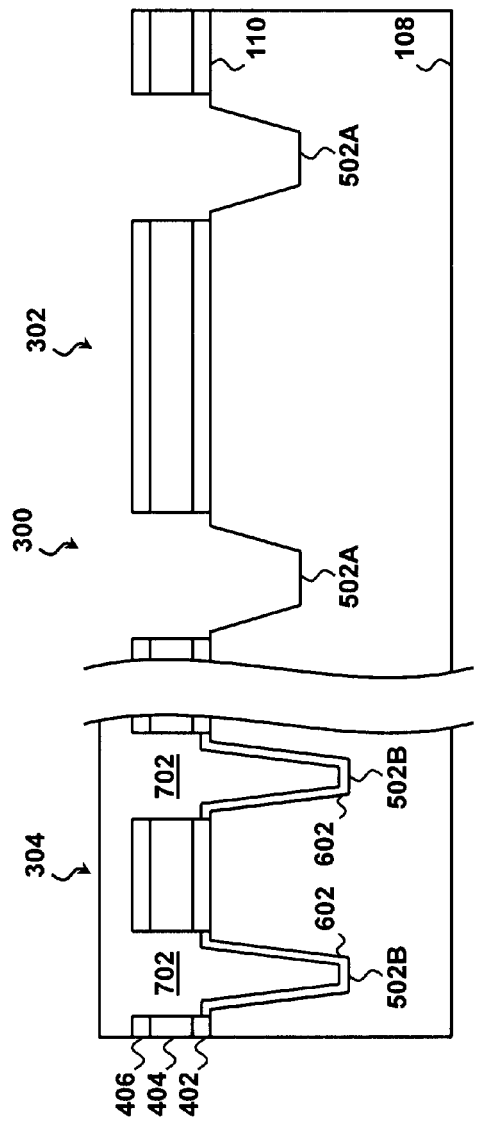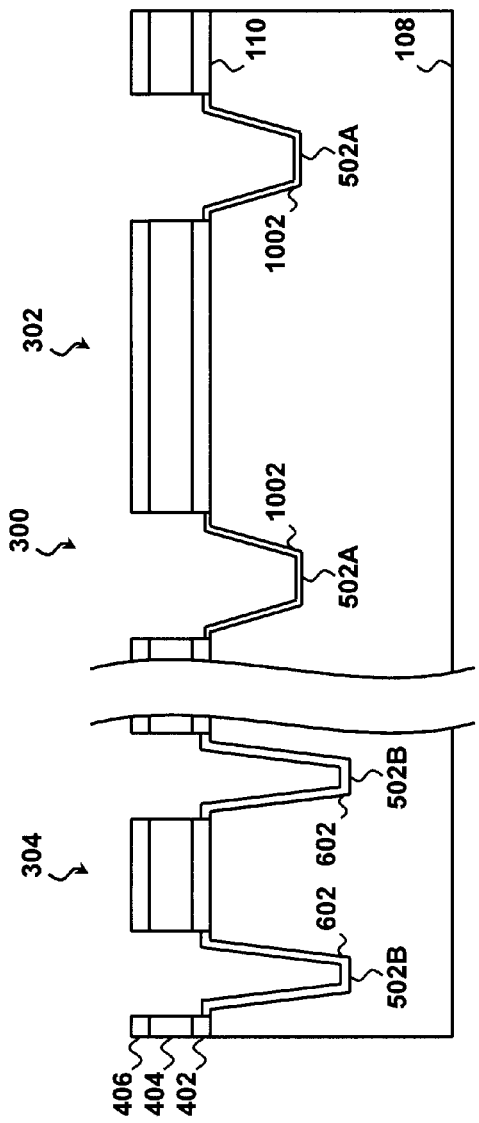

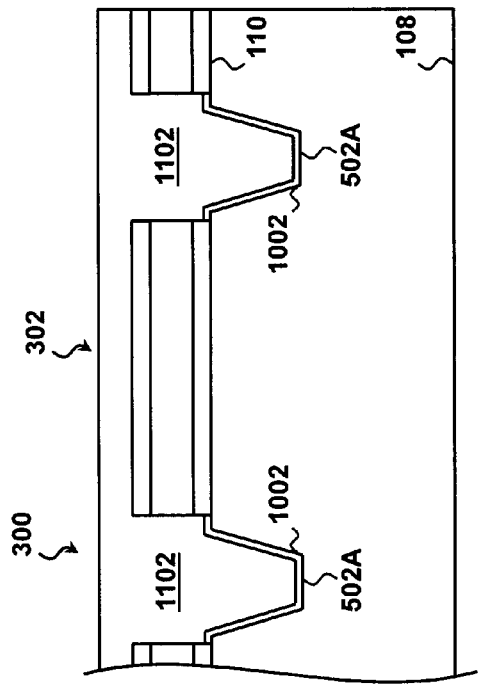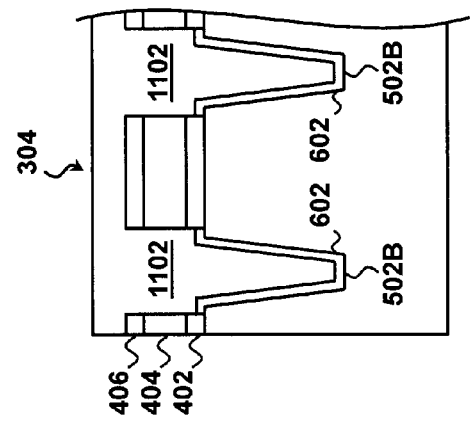
Fig. 11
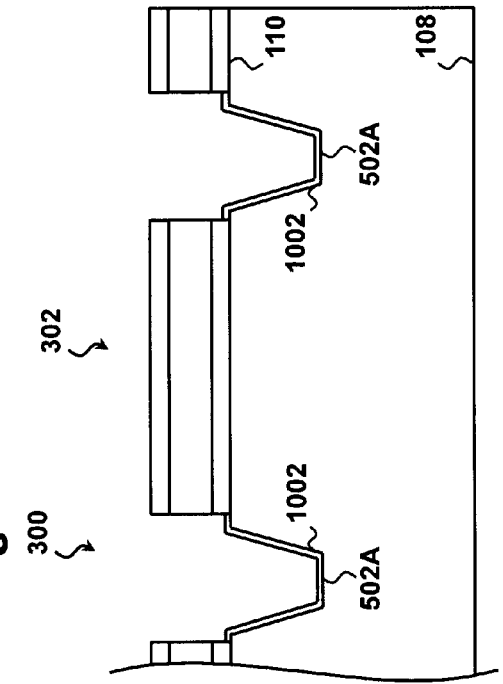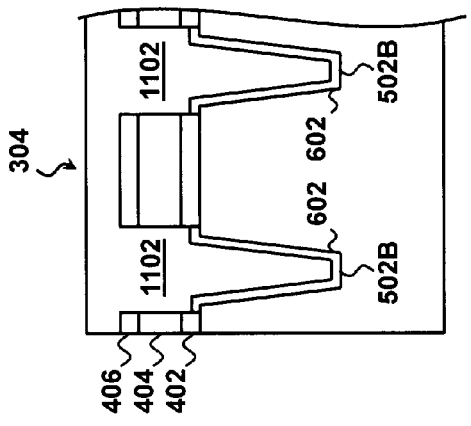
Fig. 12

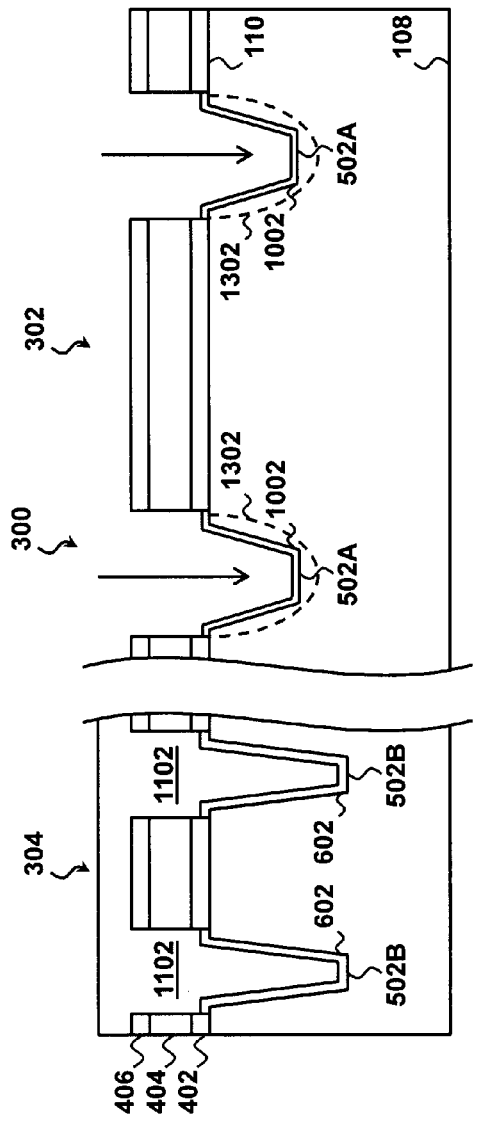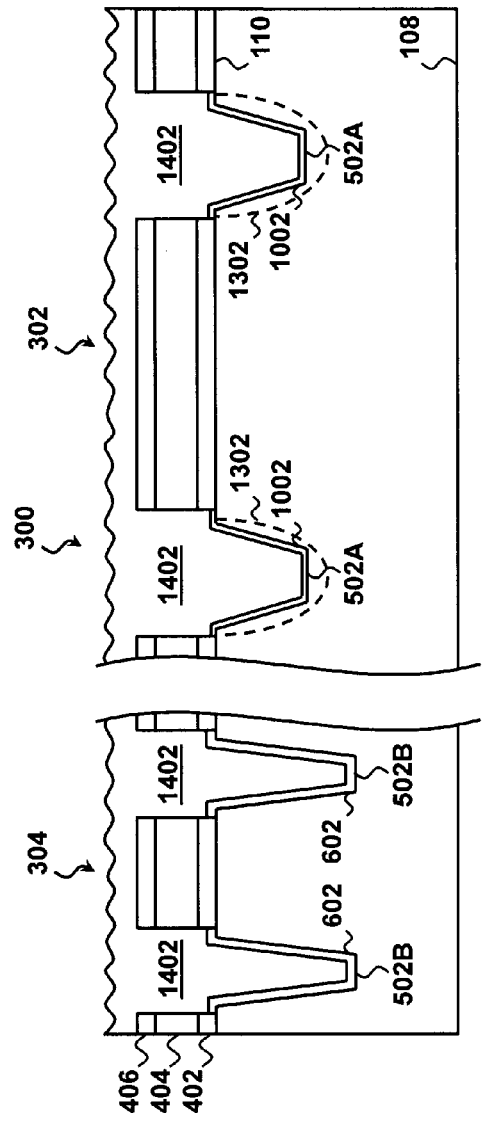

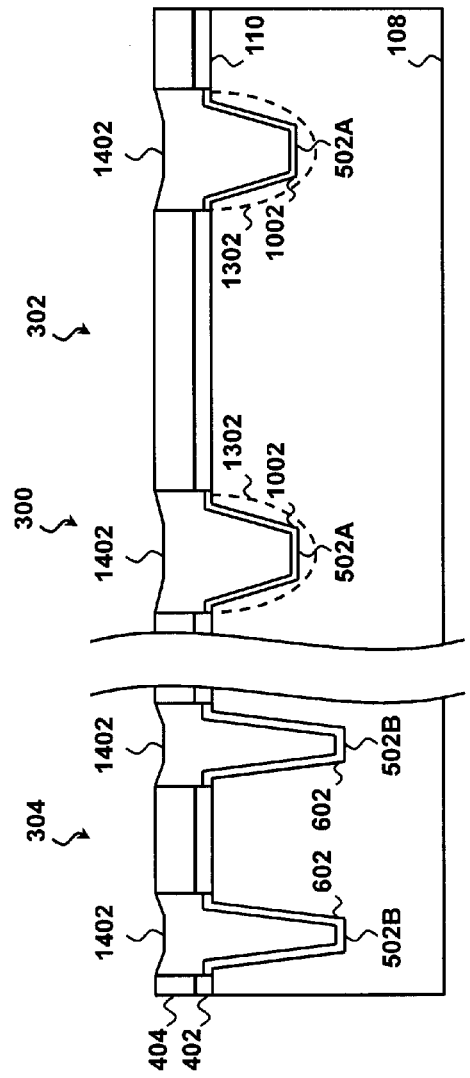
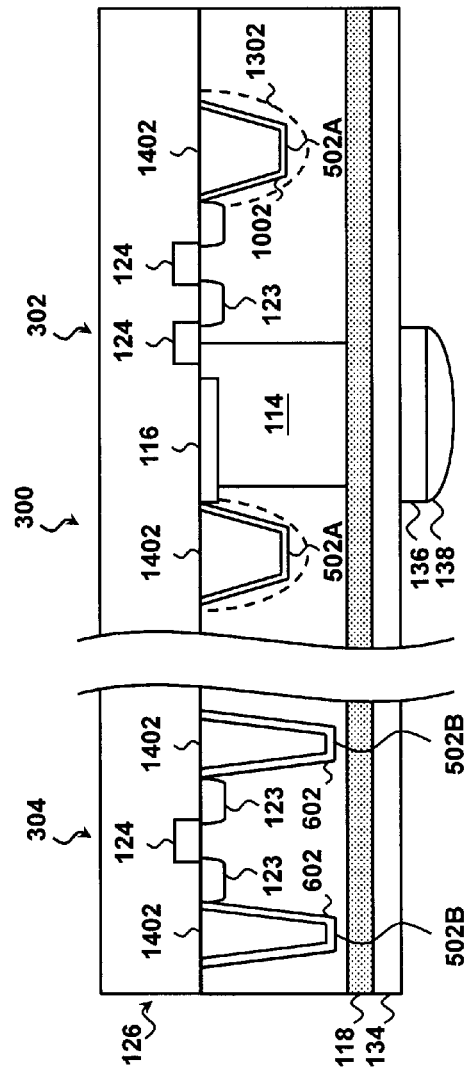
Fig. 15
Fig. 16

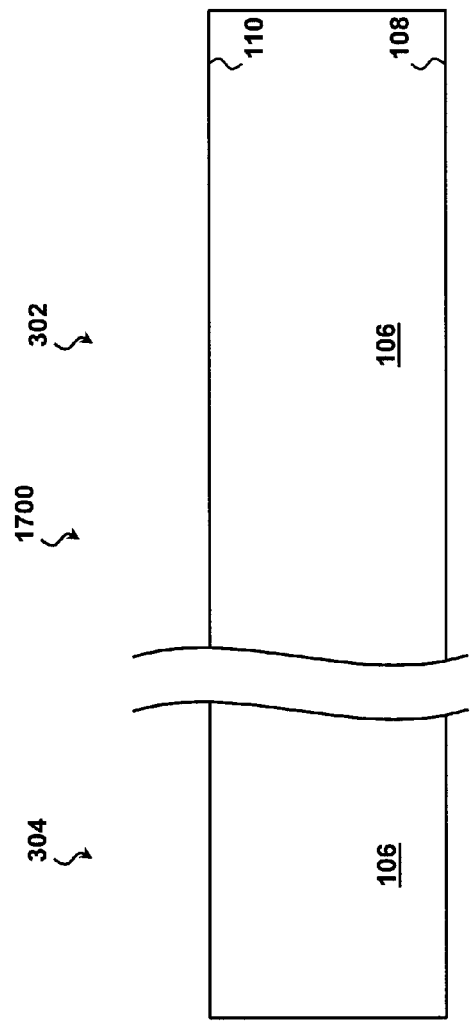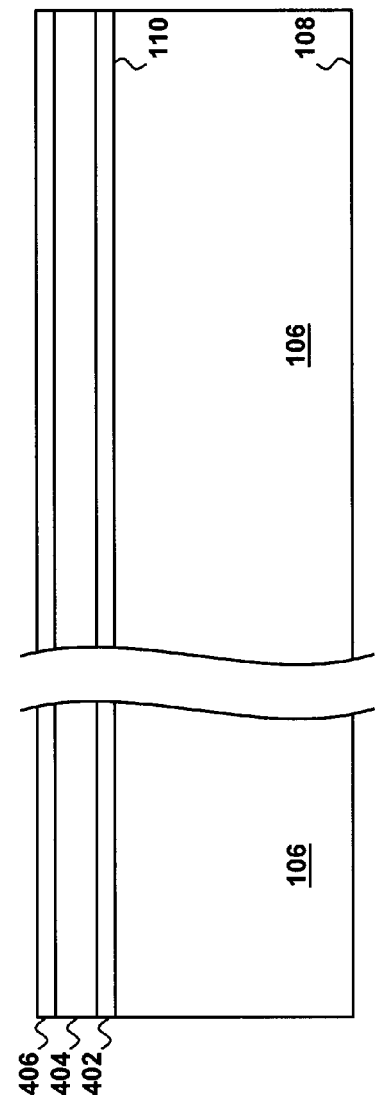

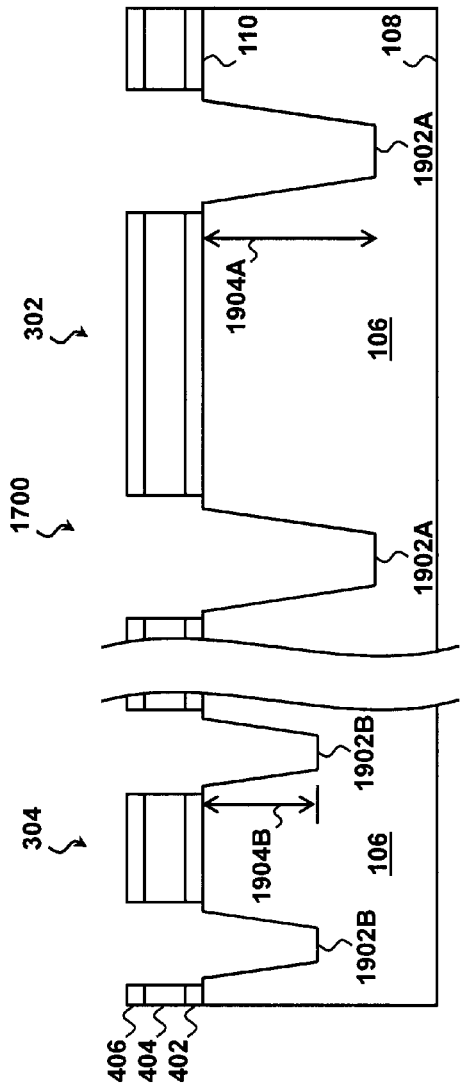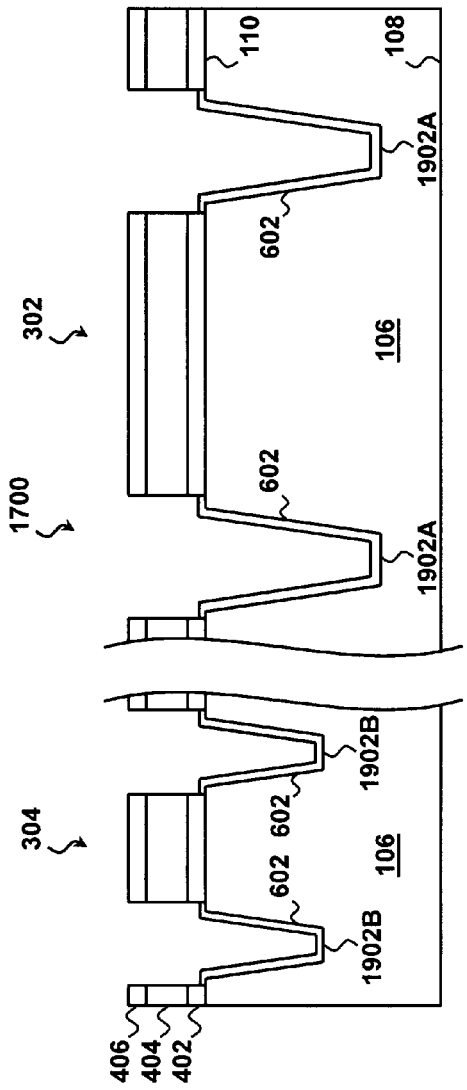

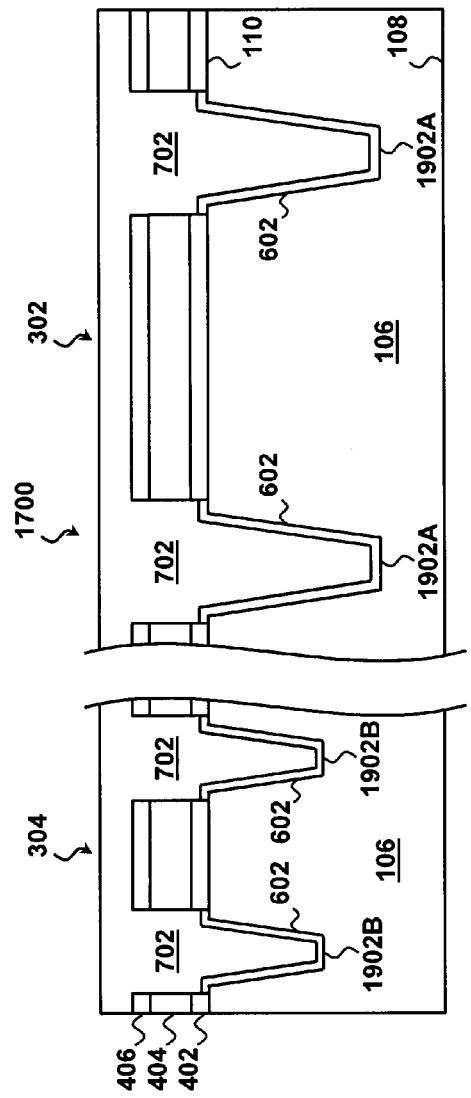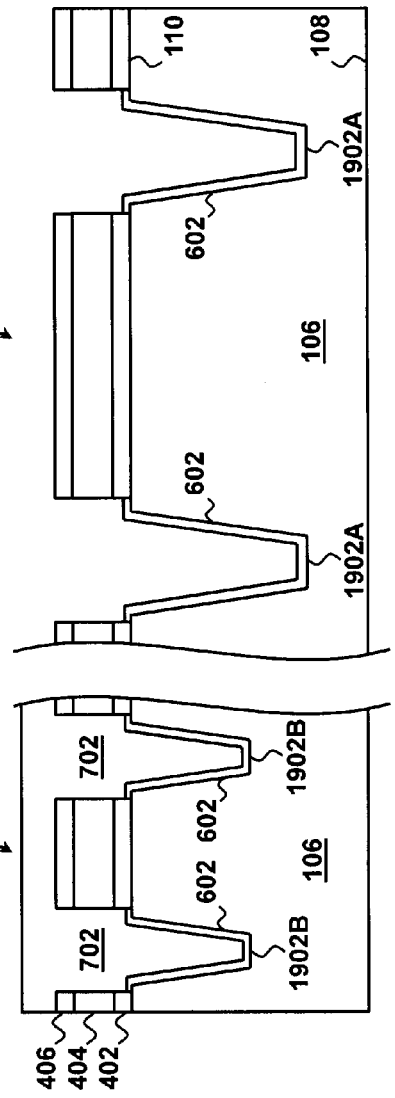
Fig. 21
Fig. 22

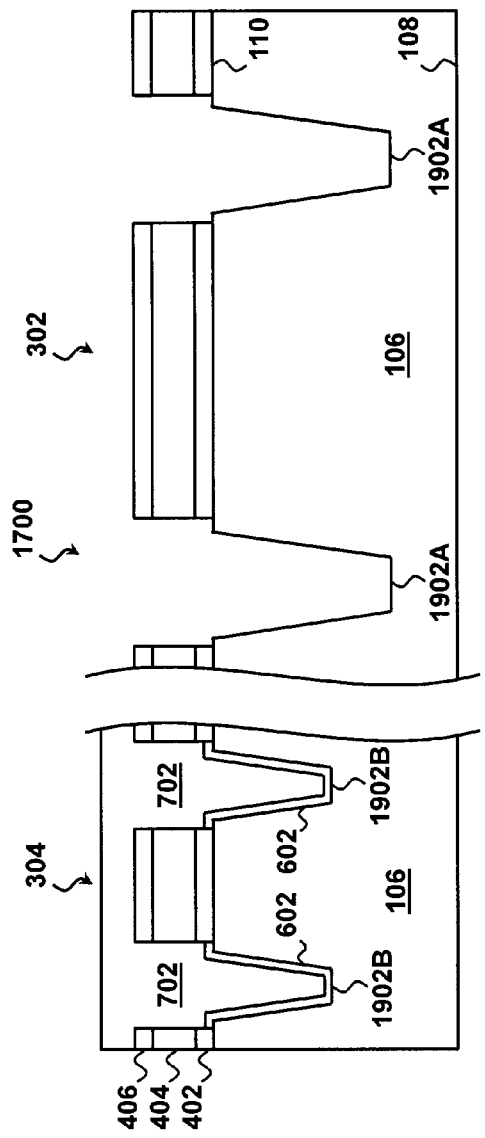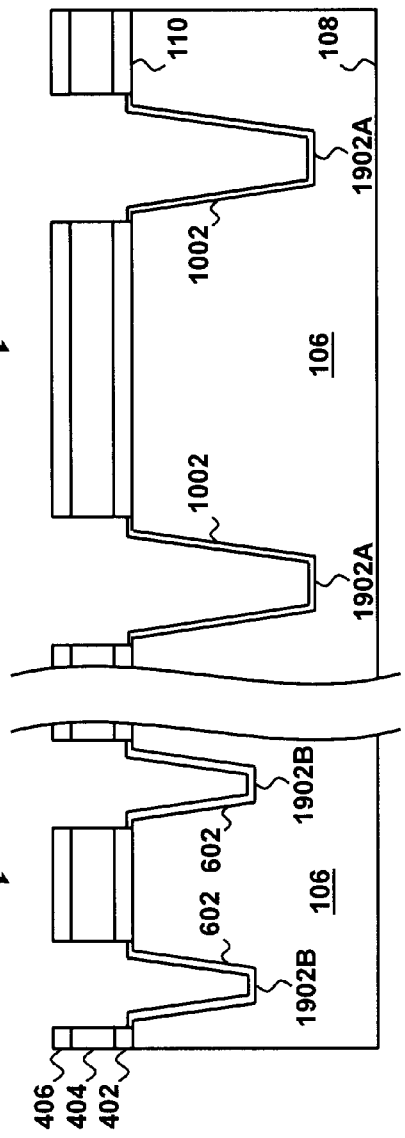
Fig. 23
Fig. 24

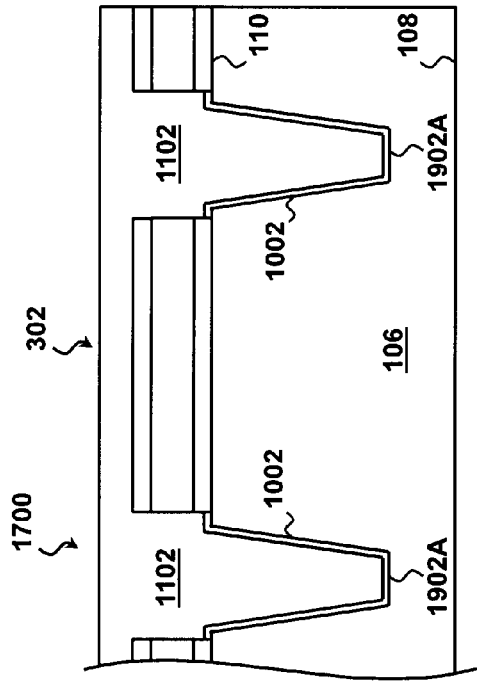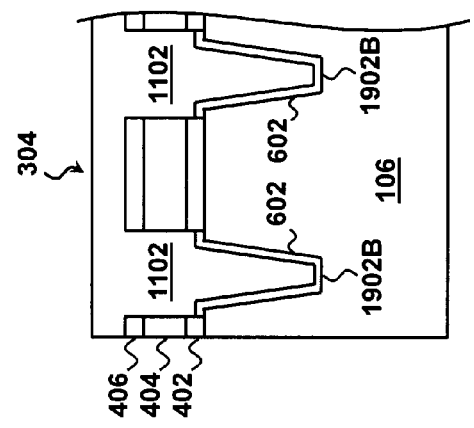
Fig. 25
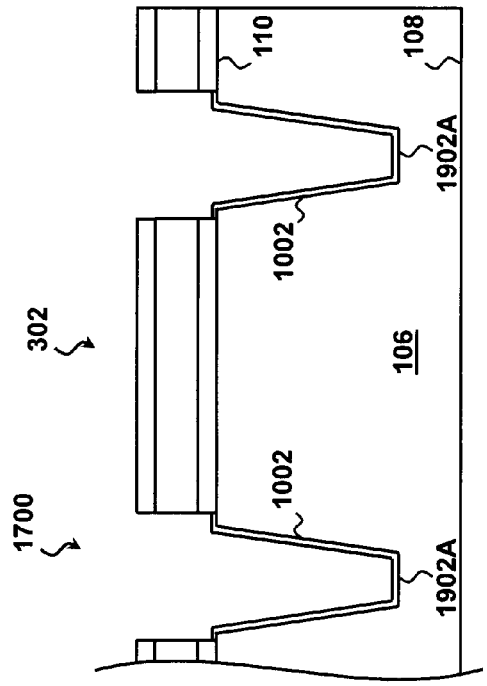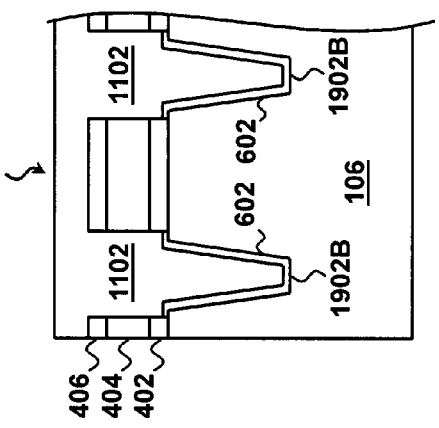
Fig. 26

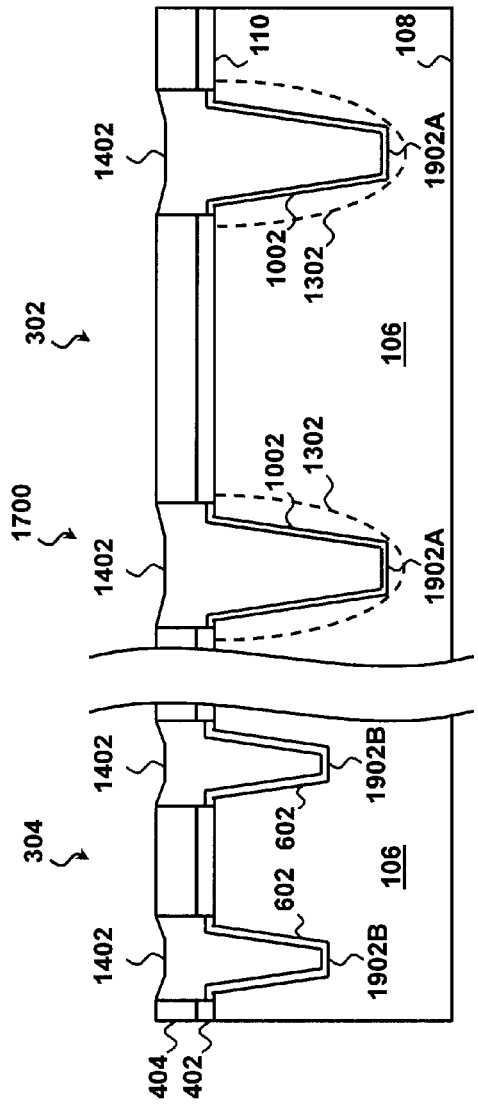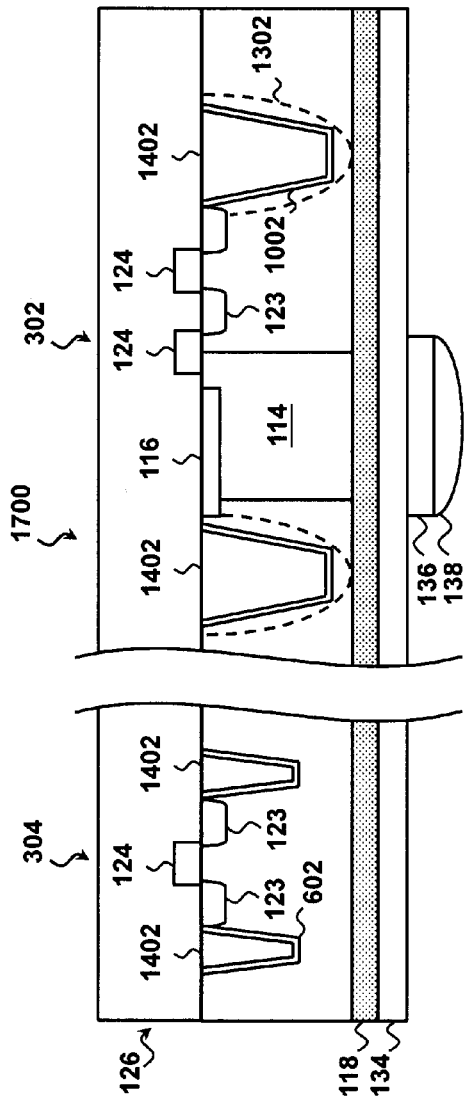

VARIED STI LINERS FOR ISOLATION STRUCTURES IN IMAGE SENSING DEVICES

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

As merely one example, challenges have arisen when attempting to scale image sensor devices. Image sensors are integrated circuits used to detect and measure radiation, such as light, received by the sensor device. These image sensor arrays are incorporated into digital cameras and other consumer devices. One type of sensor, the backside-illuminated (BSI) image sensor, is typically formed on a thin substrate that allows the radiation to reach the sensor by passing through the substrate as opposed to passing through an interconnect structure formed on the opposite or front side of the substrate. The advantage to backside-illuminated devices is that the interconnect structure (which typically includes opaque conductive traces) does not obstruct the incoming radiation. When clustered in an array, individual BSI sensors may be separated by isolation structures to reduce "dark current" (the flow of current when a sensor is not exposed to radiation) and inter-sensor interference. However, as size of an isolation structure is reduced, the amount of isolation provided decreases. Thus, scaling down image sensors can increase unwanted behavior including dark current and sensor noise. Therefore, although existing fabrication process for forming BSI sensors have been generally adequate, they have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3-16 are cross-sectional views of an integrated circuit undergoing a method of forming a plurality of isolation features adapted for disparate applications according to various aspects of the present disclosure.

FIGS. 17-30 are cross-sectional views of a further integrated circuit undergoing a method of forming a plurality of isolation features adapted for disparate applications according to various aspects of the present disclosure.

DETAILED DESCRIPTION

Figure 1:
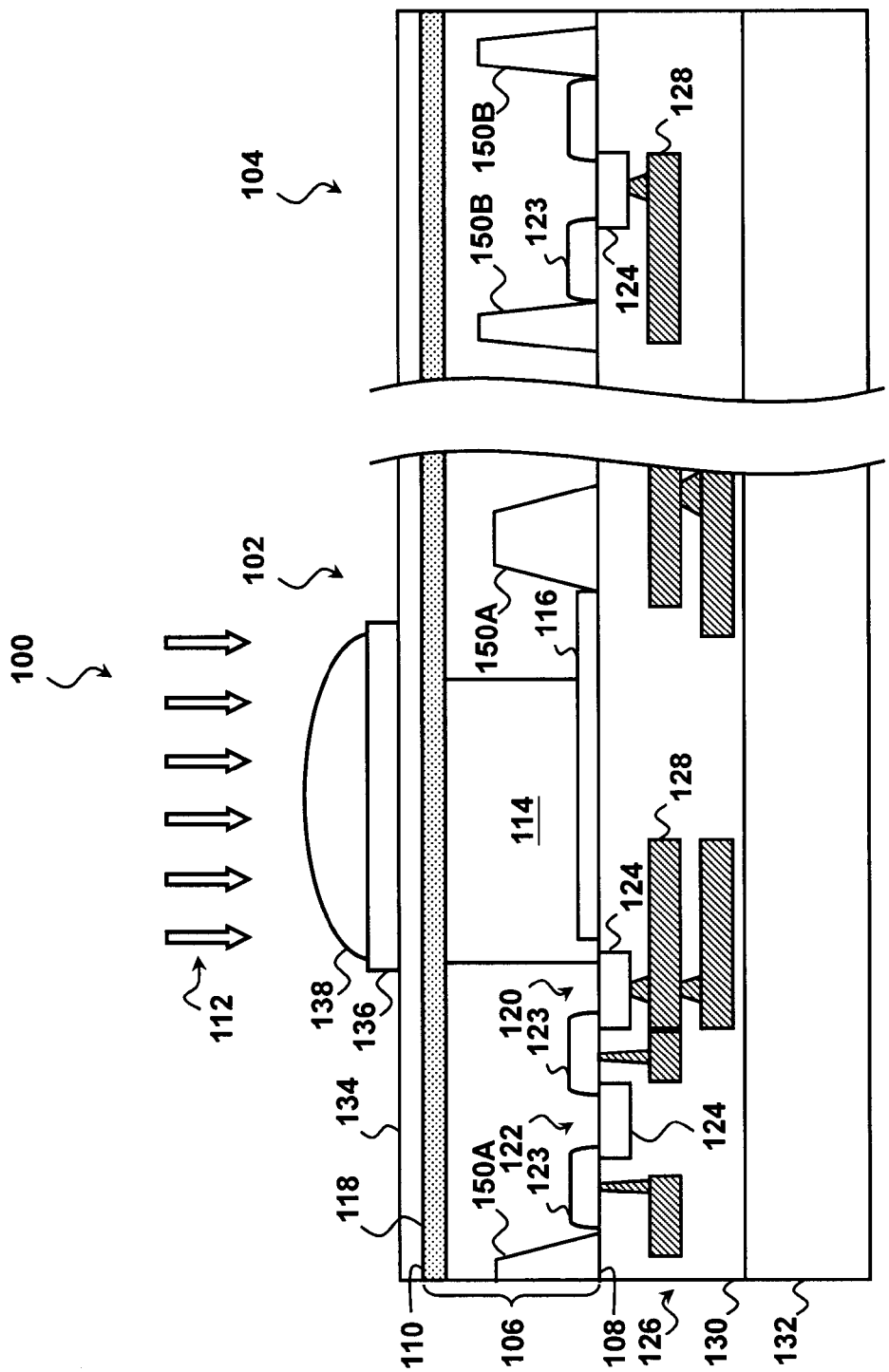
FIG. 1 is a cross-sectional view of an integrated circuit device according to various aspects of the present disclosure.

The present disclosure relates generally to IC device manufacturing and more particularly, to an integrated circuit device including a plurality of isolation trench structures adapted for disparate applications and to a method of forming the circuit device.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a cross-sectional view of an integrated circuit device 100 according to various aspects of the present disclosure. FIG. 1 has been simplified for the sake of clarity to better illustrate the inventive concepts of the present disclosure. Additional features can be incorporated into the integrated circuit device 100, and some of the features described below can be replaced or eliminated for other embodiments of the integrated circuit device 100.

The integrated circuit device 100 may be an integrated circuit (IC) chip, a system on chip (SoC), or a portion thereof and may include various passive and active microelectronic components. These components may include a backside illuminated (BSI) image sensor element 102 and a peripheral circuit element 104. In some embodiments, the peripheral circuit element 104 is operable to interface with or control the image sensor element 102. Although, in further embodiments, the peripheral circuit element 104 has no functional relationship to the image sensor element 102 aside from being collocated on the same substrate 106. In the illustrated embodiment, the peripheral circuit element 104 is a field effect transistor, although it is understood that the principles of the present disclosure may be applied to any other suitable circuit element. For example, the principles may be applied to P-channel field effect transistors (PFETs), N-channel FETs (NFETs), metal-oxide semiconductor field effect transistors (MOSFETs), complementary metal-oxide semiconductor (CMOS) transistors, FinFETs, high voltage transistors, high frequency transistors, bipolar junction transistors, resistors, capacitors, diodes, fuses, other suitable devices, and/or combinations thereof.

The integrated circuit device 100 includes a substrate 106 having a front surface 108 and a back surface 110. In some embodiments, the substrate 106 includes an elementary semiconductor such as silicon or germanium and/or a compound semiconductor, such as silicon germanium, silicon carbide, gallium arsenic, indium arsenide, gallium nitride, and indium phosphide. Other exemplary substrate materials include alloy semiconductors, such as silicon germanium carbide, gallium arsenic phosphide, and gallium indium phosphide. The substrate 106 may also comprise non-semiconductor materials including soda-lime glass, fused silica, fused quartz, calcium fluoride ($CaF_2$), and/or other suitable materials. In some embodiments, the substrate 106 has one or more layers defined within it, such as an epitaxial layer. For example, in one such embodiment, the substrate 106 includes an epitaxial layer overlying a bulk semiconductor. Other layered substrates include semiconductor-on-insulator (SOI) substrates. In one such SOI substrate, the substrate 106 includes a buried oxide (BOX) layer formed by a process such as separation by implanted oxygen (SIMOX). In various embodiments, the substrate 106 may take the form of a planar substrate, a fin, a nanowire, and/or other forms known to one of skill in the art.

The substrate 106 may include one or more doped regions. In the depicted embodiment, the substrate 106 is doped with a p-type dopant. Suitable p-type dopants include boron, gallium, indium, other suitable p-type dopants, and/or combinations thereof. The substrate may also include one or more regions doped with an n-type dopant such as phosphorus, arsenic, other suitable n-type dopants, and/or combinations thereof. Doping may be implemented using a process such as ion implantation or diffusion in various steps and techniques.

As noted above, the integrated circuit device 100 includes a sensor element (or sensor pixel) 102. The sensor element 102 may be a standalone sensor or an integral part of a larger pixel array, such as the array commonly found in a digital camera sensor. The sensor element 102 detects the intensity (brightness) of incident radiation 112, such as light, directed toward the back surface 110 of the substrate 106. In some embodiments, the incident radiation is visual light. Alternatively, the radiation 112 may be infrared (IR), ultraviolet (UV), x-ray, microwave, other suitable radiation, and/or combinations thereof. The sensor element 102 may be configured to respond to particular wavelengths or ranges of wavelengths, such as red, green, and blue wavelengths within the visible light spectrum. In other words, the sensor element 102 may be configured to only measure radiation falling within a particular spectrum or range of wavelengths.

In the depicted embodiment, the sensor element 102 includes a photodetector, such as a photodiode, that includes a light-sensing region (or photo-sensing region) 114 and a pinned layer 116. The light-sensing region 114 is a doped region having n-type and/or p-type dopants formed in the substrate 106, specifically along the front surface 108 of the substrate 106. In the depicted embodiment, the light-sensing region 114 is an n-type doped region. The doping of the light-sensing region 114 may be performed by a method such as diffusion and/or ion implantation. The pinned layer 116 is formed adjacent to the light-sensing region 114 at the front surface 108 of the substrate 106 and may be doped with an opposite type dopant than that of the light-sensing region 114. For example, in the depicted embodiment, the pinned layer 116 is a p-type implanted layer.

A doped layer 118 is formed opposite the pinned layer 116 at the back surface 110 of the substrate 106. The doped layer 118 is formed by an implantation process, diffusion process, annealing process, other process, and/or combinations thereof. In the depicted embodiment, the doped layer 118 includes p-type dopants, such as boron, gallium, indium, other p-type dopants, and/or combinations thereof. Alternatively, the doped layer 118 includes n-type dopants, such as phosphorus, arsenic, other n-type dopants, and/or combinations thereof. Properties of the doped layer 118 including thickness, dopant concentration, dopant profile, and/or a combination thereof are selected to optimize image quality provided by the image sensor device of the integrated circuit device 100. For example, the dopant depth, dopant concentration, dopant profile, and/or combination thereof may be optimized to increase quantum efficiency (ratio of number of carriers generated to number of photons incident upon an active region of the image sensor device), to reduce dark current (current that flows in the image sensor device in absence of incident light on the image sensor device), and/or to reduce white pixel defects (where the image sensor device includes an active region that has an excessive amount of current leakage).

In some embodiments, the sensor element 102 also includes various transistors, such as a transfer transistor 120, a reset transistor 122, a source-follower transistor (not illustrated), a select transistor (not illustrated), other suitable transistors, and/or combinations thereof. An exemplary transfer transistor 120 interposes a source/drain region 123 in proximity to the light-sensing region 114, such that a channel is defined between the source/drain region 123 and the light-sensing region 114. An exemplary reset transistor 122 interposes source/drain regions 123, such that a channel is defined between two source/drain regions 123. The functions of the transfer transistor 120 and the reset transistor 122 are disclosed in more detail below. However, in sum, the light-sensing region 114 and the various transistors (which may be collectively referred to as pixel circuitry) allow the sensor element 102 to detect intensity of the particular light wavelength.

Additional circuitry, input, and/or outputs may be used in coordination with the sensor element 102 to support communication with the sensor 102 and to provide an operating environment for the sensor 102. Peripheral circuit element 104 is merely one example of additional circuitry that may be formed on the same substrate 106 as the sensor element 102. In the exemplary embodiment, peripheral circuit element 104 is a field effect transistor (FET). In further embodiments, the circuit element 104 includes P-channel field effect transistors (PFET), N-channel FET (NFET), metal-oxide semiconductor field effect transistors (MOSFET), complementary metal-oxide semiconductor (CMOS) transistors, FinFETs, high voltage transistors, high frequency transistors, bipolar junction transistors, resistors, capacitors, diodes, fuses, other suitable devices, and/or combinations thereof.

In that regard, the circuit element 104 may include one or more doped source/drain regions 123 formed on the substrate 106. P-type source/drain regions 123 may be doped using suitable p-type dopants include boron, gallium, indium, other suitable p-type dopants, and/or combinations thereof. N-type source/drain regions 123 may be doped using suitable n-type dopants such as phosphorus, arsenic, other suitable n-type dopants, and/or combinations thereof. Doping may be performed using a process such as ion implantation or diffusion in various steps and techniques.

Circuit element 104 may also include a gate structure 124 substantially similar to the gate structures of the transfer transistor 120 and/or the reset transistor 122. Accordingly, gate structure 124, the transfer gate, and/or the reset gate may include a gate dielectric disposed on the substrate 106, a gate electrode disposed on the gate dielectric, and/or other elements such as interfacial layers and gate sidewall spacers. In some embodiments, the gate dielectric includes a high-k dielectric material, silicon oxynitride, silicon nitride, other suitable dielectric materials, and/or combinations thereof formed by thermal oxidation, chemical vapor deposition (CVD), physical vapor deposition (PVD), atomic layer deposition (ALD), other suitable processes, and/or combinations thereof. In some embodiments, the gate dielectric has a multilayer structure, such as a layer of silicon oxide and a layer of a high-k dielectric material formed on the silicon dioxide layer. In some embodiments, the gate electrode includes a polycrystalline silicon (polysilicon) material and/or a metal gate electrode material, such as Al, Cu, W, Ti, Ta, TiN, TaN, NiSi, CoSi, other suitable conductive materials, and/or combinations thereof. The formation of a metal gate electrode may include first forming a polysilicon dummy gate and subsequently replacing the dummy gate with the final metal gate.

The gates and contacts of the sensor element 102 and the circuit element 104 are electrically coupled to a multilayer interconnect (MLI) 126 disposed over the front surface 108 of the substrate 106 including over the sensor element 102 and the circuit element 104. The MLI 126 electrically couples the devices of the integrated circuit device 100 and therefore includes conductive features 128, such as contacts, vias, and/or conductive traces. The conductive features 128 include materials such as copper, aluminum, aluminum/silicon/copper alloy, titanium, titanium nitride, tungsten, polysilicon, metal silicide, and/or combinations thereof. The conductive features 128 are disposed throughout an insulative interlayer (or inter-level) dielectric (ILD) 130. The ILD 130 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other suitable material, and/or combinations thereof. In an example, the conductive features 128 and the ILD 130 are be formed in an integrated process including a damascene process, such as a dual damascene process or single damascene process.

At various stages during the fabrication of integrated circuit device 100, a carrier wafer 132 is disposed over the front surface 108 of the substrate 106. In the depicted embodiment, the carrier wafer 132 is bonded to the MLI 126. In various embodiments, the carrier wafer 132 include silicon, soda-lime glass, fused silica, fused quartz, calcium fluoride (CaF$_2$), and/or other suitable materials. The carrier wafer 132 provides protection for the various features (such as the sensor element 102) formed on the front surface 108 of the substrate 106 and provides mechanical strength and support for processing the back surface 110 of the substrate 106. The carrier wafer 132 may also provide support for the finished integrated circuit device 100 and may be incorporated into a package for the integrated circuit device 100.

Turning now to the back surface 110 of the substrate, the integrated circuit device 100 includes features such as an anti-reflective layer 134, a color filter 136, and/or a lens 138 disposed over the back surface 110 of the substrate 106. In the depicted embodiment, the anti-reflective layer 134 is disposed between the back surface 110 of the substrate 106 and the color filter 136 and includes a dielectric material, such as silicon nitride or silicon oxynitride. The color filter 136 is disposed over the anti-reflective layer 134 and is aligned with the light-sensing region 114 of the sensor element 102. The color filter 136 filters out incident radiation outside a predetermined range of wavelengths. For example, the color filter 136 may filter visible light of a red wavelength, a green wavelength, or a blue wavelength such that light outside the selected spectrum does not reach the sensor element 102. The color filter 136 may include a dye-based (or pigment-based) polymer, a resin, organic pigments, and/or other suitable filter materials.

The lens 138 is disposed over the back surface 110 of the substrate 106, particularly over the color filter 136 and is aligned with the light-sensing region 114 of the sensor element 102. The lens 138 may be in various positional arrangements with the sensor element 102 and color filter 136 such that the lens 138 focuses the incident radiation 112 on the light-sensing region 114 of the sensor element 102. Alternatively, the position of the color filter 136 and lens 138 may be reversed, such that the lens 138 is disposed between the anti-reflective layer 134 and the color filter 136. The present disclosure also contemplates layers of a color filter 136 disposed between layers of a lens 138. The lens 138 includes a suitable material, and may have a variety of shapes and sizes depending on an index of refraction of the material used for the lens and/or a distance between the lens and light sensing region 114.

In operation, the integrated circuit device 100 receives radiation 112 directed towards the back surface 110 of the substrate 106. The lens 138 focuses the incident radiation 112, which then passes through the color filter 136 and the anti-reflective layer 134 to the light-sensing region 114 of the sensor element 102. In a backside illuminated configuration, radiation 112 passing through to the color filter 136 and sensor element 102 may be maximized since the energy is not obstructed by various device features (for example, gate electrodes) and/or metal features (for example, the conductive features 128 of the MLI 126) overlying the front surface 108 of the substrate 106. In response to the radiation 112, the light-sensing region 114 of the sensor element 102 produces and accumulates charge as long as the transfer transistor 120 is in an "off" state. When the transfer transistor 120 is in an "on" state, the accumulated charge can transfer to the source/drain region (floating diffusion region) 123. A source-follower transistor (not illustrated) may convert the charge to voltage signals. Prior to charge transfer, the source/drain regions 123 may be set to a predetermined voltage by turning on the reset transistor 122. In an example, the pinned layer 116 and the doped layer 118 may have a same potential, such as a potential of the substrate 106, such that the light-sensing region 114 is fully depleted at a pinning voltage ($V_{PIN}$) and a potential of the sensor element 102 is pinned to a constant value, $V_{PIN}$, when the light-sensing region 114 is fully depleted.

In order to reduce crosstalk and electrical interference between components of the integrated circuit device 100, the substrate 106 may include isolation features such as shallow trench isolation features (STIs) and/or deep trench isolation features disposed between components. In the illustrated embodiment, a first type of isolation feature 150A is disposed between sensor elements (e.g., between sensor element 102 and an adjacent sensor element not illustrated) and a second type of isolation feature 150B is disposed between circuit elements (e.g., between circuit element 104 and an adjacent sensor element not illustrated). As disclosed in detail below, isolation requirements of sensor elements 102 may differ from those of circuit elements 104. Independent configuration of isolation features 150A and isolation features 150B allows the isolation features to be tuned to their respective operating environment. Accordingly, in some embodiments, properties of isolation features 150A such as width, depth, fill material, ion implantation characteristics, other properties, and/or combinations thereof are configured to provide optimal isolation for adjacent image sensor elements 102, while properties of isolation features 150B are configured to provide optimal isolation for adjacent circuit elements 104.

Figure 2A:
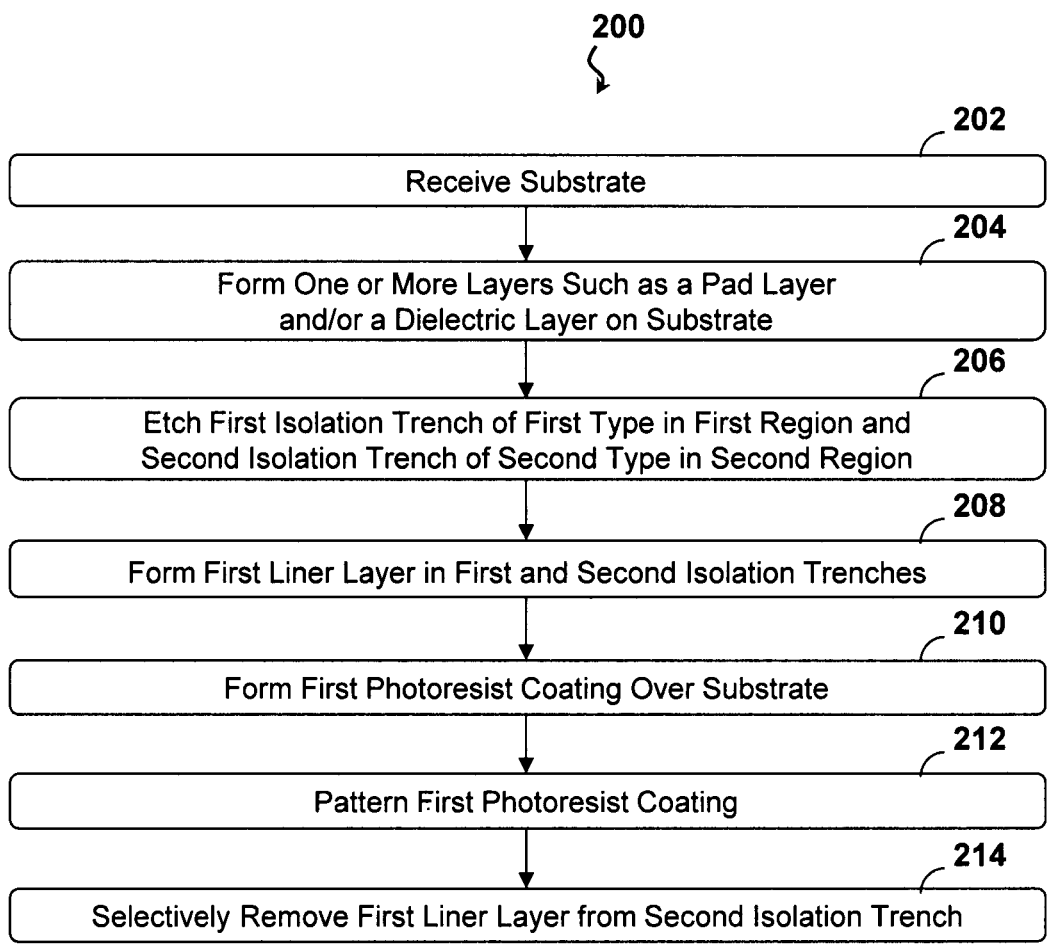
FIGS. 2A and 2B are flow diagrams of a method for forming a plurality of isolation features adapted for disparate applications according to various aspects of the present disclosure.
Figure 2B:
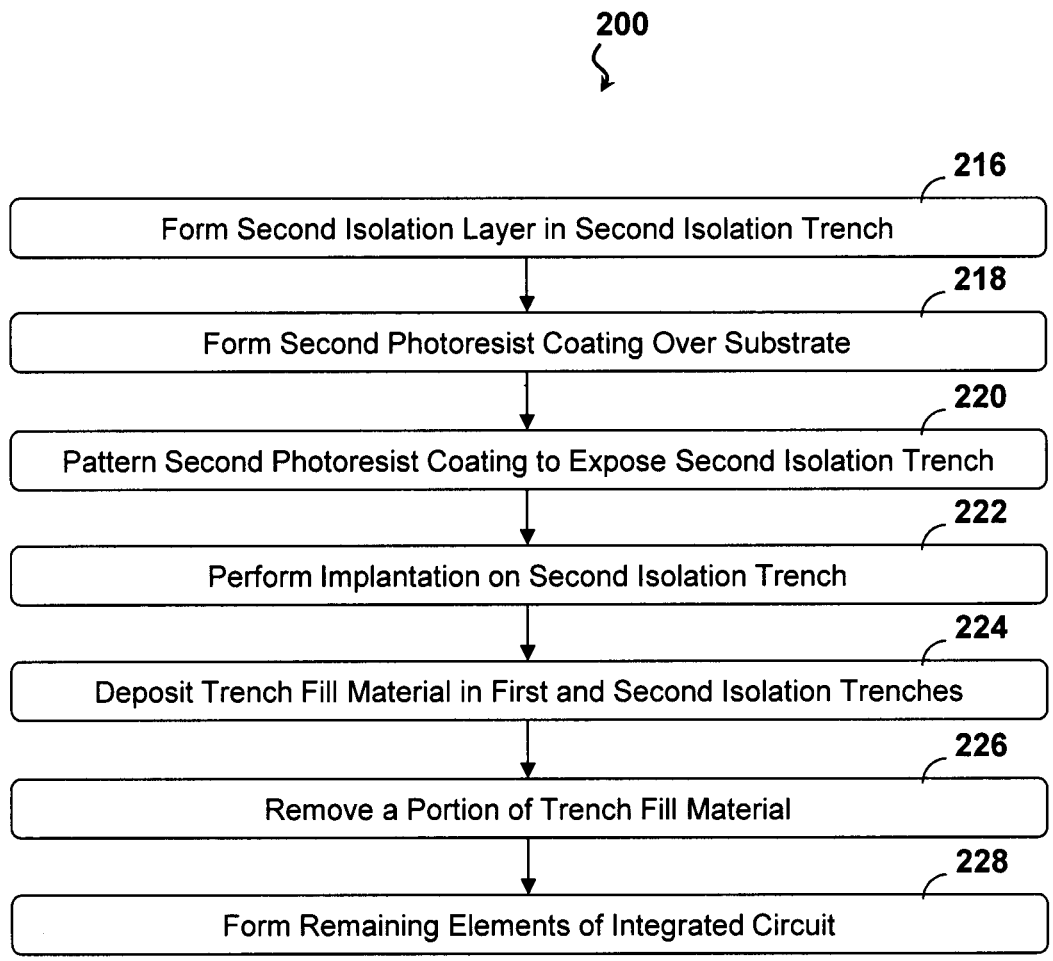

A method 200 for forming a plurality of isolation features adapted for disparate applications is disclosed with reference to FIGS. 2A, 2B, and FIGS. 3-16. FIGS. 2A and 2B are flow diagrams of the method 200 for forming a plurality of isolation features adapted for disparate applications according to various aspects of the present disclosure. It is understood that additional steps can be provided before, during, and after the method 200, and some of the steps described can be replaced or eliminated for other embodiments of the method 200. FIGS. 3-16 are cross-sectional views of an integrated circuit 300 comprising a sensor region 302 and a circuit region 304 undergoing the method 200 of forming a plurality of isolation features adapted for disparate applications according to various aspects of the present disclosure. FIGS. 3-16 have been simplified for the sake of clarity to better illustrate the inventive concepts of the present disclosure.

Referring to block 202 of FIG. 2A and to FIG. 3, a substrate 106 is received. The substrate 106 may be substantially similar to substrate 106 described with respect to FIG. 1. In that regard, the substrate 106 may include an elementary semiconductor, a compound semiconductor, an alloy semiconductor, a non-semiconductor material, and/or combinations thereof. In various embodiments, the substrate 106 may take the form of a planar substrate, a fin, a nanowire, and/or other forms known to one of skill in the art. The substrate includes a front surface 108 and a back surface 110 substantially similar to those described with respect to FIG. 1. For reference, the orientation of FIG. 1 differs from that of FIGS. 3-16. However, this variation does not describe or imply a difference in the elements illustrated therein.

Referring to block 204 of FIG. 2A and to FIG. 4, one or more layers such as a pad layer 402, a first dielectric layer 404, and/or a second dielectric layer 406 may be formed on the back surface 110 of the substrate 106. The layers may be formed of any suitable material including an oxide material, such as silicon oxide; a nitrogen-containing material, such as silicon nitride or silicon oxynitride, an amorphous carbon material; silicon carbide; tetraethylorthosilicate (TEOS); other suitable materials; and/or combinations thereof. Common methods for forming the layers include thermal oxidation, CVD, high-density plasma CVD (HDP-CVD), PVD, ALD, spin-on deposition, and/or other suitable deposition processes. In an exemplary embodiment, the pad layer 402 includes a silicon oxide, the first dielectric layer 404 includes silicon nitride, and the second dielectric layer 406 includes a silicon oxide.

Referring to block 206 of FIG. 2A and to FIG. 5, isolation trenches (e.g., trenches 502A and 502B) are formed on the substrate 106 extending from the back surface 110 and into the substrate 106. The isolation trenches include a first type of isolation trench 502A disposed in the sensor region 302 and a second type of isolation trench 502B disposed in the circuit region 304. Isolation trenches 502A and 502B may be formed by a process including photolithography such as binary photolithography or phase shift photolithography coupled with etching such as wet or dry etching. In the illustrated embodiment, isolation trenches 502A and 502B have different profiles based, in part, on different isolation requirements of components to be formed in the sensor region 302 as compared to components to be formed in the circuit region 304. In such embodiments, isolation trenches 502A and 502B may be formed independently using separate photolithography and etching steps, or formed concurrently using a single photolithography and etching process.

As an example of differing isolation requirements, pixel elements may exhibit "dark current" (current generated in the image sensor device in absence of incident light on the image sensor device) and inter-pixel noise (charge fluctuations in an image sensor caused by operation of an adjacent sensor). Both of these may be reduced by forming isolation features that prevent current flow through the substrate 106. However, the etching of the isolation trench may cause defects in the substrate 106 that act as carriers. These defects promote current flow around the isolation feature. Somewhat counter intuitively, in some embodiments, deeper isolation features may actually provide less isolation for sensor elements than shallower features by introducing greater numbers of defects when forming the trench. This is not necessarily characteristic of all embodiments.

In contrast, in the circuit region 304, where devices are less sensitive to noise and leakage and where dark current is not a concern, a second configuration of isolation feature may be more beneficial. Therefore, in the illustrated embodiment, isolation trenches 502A have a shallower depth 504A than isolation trenches 502B formed to depth 504B. In one such embodiment, isolation trenches 502A are formed to a depth 504A of less than or equal to about 1500 Angstroms and isolation trenches 502B are formed to a depth 504B between about 2500 Angstroms and about 3000 Angstroms. As a further example of differing isolation requirements, in the sensor region 302, device density may not be as great a concern as in the circuit region 304. Therefore, isolation trenches 502A may be wider than isolation trenches 502B.

Referring now to block 208 of FIG. 2A and to FIG. 6, a first liner layer 602 is formed in isolation trenches 502A and 502B. The first liner layer 602 may be characteristic of a thick liner layer, and in that regard, may be formed to a thickness greater than or equal to about 100 Angstroms. The first liner layer 602 may be formed by any suitable process including a thermal oxidation process, a rapid-thermal oxidation process, CVD, HDP-CVD, PVD, ALD, and/or other suitable methods. In an exemplary embodiment, the first liner layer 602 is formed using a dry thermal oxidation process performed at between about 800° C. and about 1200° C.

Referring now to block 210 of FIG. 2A and to FIG. 7, a first photoresist coating 702 is applied over the substrate following the formation of the first liner layer 602. The first photoresist coating 702 may be applied by any suitable technique including spin-on deposition. Referring now to FIG. 8 and block 212 of FIG. 2A, the first photoresist coating 702 is patterned. The patterning of block 208 may include soft baking, mask aligning, exposure, post-exposure baking, developing the photoresist, rinsing, and drying (e.g., hard baking). Alternatively, the photolithographic process may be implemented, supplemented, or replaced by other methods such as maskless photolithography, electron-beam writing, and ion-beam writing. In the illustrated embodiment, the development of the photoresist coating 702 exposes isolation trenches 502A of the sensor region 302 while protecting isolation trenches 502B of the circuit region 304.

Referring now to block 214 of FIG. 2A and to FIG. 9, the first liner layer 602 is selectively removed from the isolation trenches 502A within the sensor region 302. Suitable removal processes include dry etching, wet etching, and/or other etching methods (e.g., reactive ion etching). In an embodiment, the liner layer 602 is removed using a dilute HF solution. After the first liner layer 602 is removed, the first photoresist coating 702 may be stripped.

Referring to block 216 of FIG. 2B and to FIG. 10, a second liner layer 1002 is formed in isolation trenches 502A. Forming the first liner layer 602 and the second liner layer 1002 independently allows the formation of a second liner layer 1002 with different physical characteristics than the first liner layer 602. For example, the second liner layer 1002 may be characteristic of a thin liner layer, and in that regard, may be formed to a thickness of less than or equal to about 100 Angstroms. In various exemplary embodiments, the second liner layer 102 ranges in thickness from about 1 Angstrom to about 100 Angstroms. In one such embodiment, the second liner layer 102 has a thickness of less than about 20 Angstroms. The second liner layer 1002 may be formed by any suitable process including a thermal oxidation process, a rapid-thermal oxidation process, CVD, HDP-CVD, PVD, ALD, and/or other suitable methods. In an exemplary embodiment, the second liner layer 1002 is formed using a dry thermal oxidation process performed at between about 800° C. and about 1200° C.

Referring to block 218 of FIG. 2B and to FIG. 11, a second photoresist coating 1102 is applied over the substrate following the formation of the second liner layer 1002. The second photoresist coating 1102 may be applied by any suitable technique including spin-on deposition. Referring to block 220 of FIG. 2B and to FIG. 12, the second photoresist coating 1102 is patterned. The patterning of block 216 may include soft baking, mask aligning, exposure, post-exposure baking, developing the photoresist, rinsing, and drying (e.g., hard baking). Alternatively, the photolithographic process may be implemented, supplemented, or replaced by other methods such as maskless photolithography, electron-beam writing, and ion-beam writing. In the illustrated embodiment, the development of the second photoresist coating 1102 exposes isolation trenches 502A of the sensor region 302 while protecting isolation trenches 502B of the circuit region 304.

Referring to block 222 of FIG. 2B and to FIG. 13, an implantation is performed on the isolation trenches 502A to form a junction isolation implantation region 1302. The junction isolation implantation region 1302 inhibits the flow of charge carriers through the portion of the substrate 106 adjacent to the isolation structures. However, the implantation energy used to form the junction isolation implantation region 1302 may create additional charge carrying defects in the substrate 106 and partially undermine the isolation benefit. One advantage to forming disparate first 602 and second 1002 liner layers is that the second liner layer 1002 can be configured to promote formation of the junction isolation implantation region 1302. For example, a thinner second liner layer 1002 in isolation trench 502A may allow for deeper and more uniform implantation with reduced implantation energy. In one exemplary embodiment, implantation of boron ions at a field energy of 10K through a liner layer 1002 about 20 Angstroms thick resulted in a higher boron doping concentration with a more uniform doping profile within the substrate 106 than implantation of boron ions at a field energy of 15K though a liner layer 1002 about 100 Angstroms thick. Greater doping concentration results in greater isolation between sensor elements 102 thereby reducing dark current and crosstalk. Furthermore, the lower implantation field energy associated with a thinner liner can reduce the number of substrate defects formed by implantation. Thus, by these mechanisms and others, the second liner layer 1002 can be configured to provide a more effective isolation structure.

In some embodiments, the second liner layer 1002 produced by method 200 allows the use of plasma implantation to form the junction isolation implantation region 1302. Plasma implantation produces fewer defects that undermine insulation feature effectiveness than traditional implantation. However, plasma doping ions may not penetrate thicker liner layers. Thus in some embodiments, a liner layer 1002 of less than about 100 Angstroms allows the use of plasma implantation whereas a liner layer 1002 of greater than about 100 Angstroms does not. After the implantation of block 218, the second photoresist coating 1102 may be stripped.

Referring to block 224 of FIG. 2B and to FIG. 14, a trench fill material 1402 is deposited in isolation trenches 502A and 502B. The trench fill material 1402 may include a semiconductor oxide (e.g., silicon oxide), a semiconductor nitride, an oxynitride, or other suitable insulating material. Methods of forming the trench fill material 1402 include high aspect ratio process (HARP), HDP-CVD, CVD, PVD, plasma enhanced chemical vapor deposition (PECVD), ALD, and/or other suitable deposition processes. In some embodiments, the trench fill material 1402 is deposited in a multi-layer process, where each iteration deposits a portion of the trench fill material 1402.

Referring to block 226 of FIG. 2B and to FIG. 15, a portion of the trench fill material 1402 is removed via a mechanical process such as chemical mechanical polishing (CMP). The CMP process may also remove one or more additional layers such as the second dielectric layer 406.

Referring to block 228 of FIG. 2B and to FIG. 16, remaining processes in the formation of the integrated circuit 300 are performed. This may include the formation of a light-sensing region 114, a pinned layer 116, a doped layer 118, source/drain regions 123, gate structures 124, a MLI 126, an anti-reflective layer 134, a color filter 136, and/or a lens 136, each substantially similar to those disclosed with reference to FIG. 1. It is understood that some of the elements of the integrated circuit 300 may be formed by conventional processing, and thus some processes are not described in detail herein.

The principles of the present disclosure are not limited to embodiments where the isolation features of the circuit region 304 extend deeper into the substrate 106 than those of the sensor region 302, nor are they limited to shallow trench isolation structures. In that regard, the method 200 is equally suitable for forming isolation features with any size relationship. As a further example, the method 200 will now be disclosed for embodiments where the isolation features of the sensor region 302 extend deeper than those of the circuit region 304. The following examples reference FIGS. 2A, 2B, and FIGS. 17-30. As disclosed above, FIGS. 2A and 2B are flow diagrams of the method 200 for forming a plurality of isolation features adapted for disparate applications according to various aspects of the present disclosure. It is understood that additional steps can be provided before, during, and after the method 200, and some of the steps described can be replaced or eliminated for other embodiments of the method 200. FIGS. 17-30 are cross-sectional views of an integrated circuit 1700 comprising a sensor region 302 and a circuit region 304 undergoing the method 200 of forming a plurality of isolation features adapted for disparate applications according to various aspects of the present disclosure. FIGS. 17-30 have been simplified for the sake of clarity to better illustrate the inventive concepts of the present disclosure.

Referring to block 202 of FIG. 2A and to FIG. 17, a substrate 106 is received. The substrate 106 may be substantially similar to substrate 106 described with respect to FIG. 1. Referring to block 204 of FIG. 2A and to FIG. 18, one or more layers such as a pad layer 402, a first dielectric layer 404, and/or a second dielectric layer 406 may be formed on the back surface 110 of the substrate 106. The pad layer 402, the first dielectric layer 404, and the second dielectric layer 406 may each be substantially similar to the respective element of FIG. 4.

Referring to block 206 of FIG. 2A and to FIG. 19, isolation trenches (e.g., trenches 1902A and 1902B) are formed on the substrate 106 extending from the back surface 110 and into the substrate 106. The isolation trenches include a first type of isolation trench 1902A disposed in the sensor region 302 and a second type of isolation trench 1902B disposed in the circuit region 304. Isolation trenches 1902A and 1902B may be formed by a process including photolithography such as binary photolithography or phase shift photolithography coupled with etching such as wet or dry etching. Isolation trenches 1902A and 1902B have different profiles based, in part, on different isolation requirements of components to be formed in the sensor region 302 as compared to components to be formed in the circuit region 304. In the illustrated embodiment, isolation trenches 1902A have a deeper depth 1904A than isolation trenches 1902B formed to depth 1904B. Trenches 1902A may be characteristic of deep trench isolation structures. In one such embodiment, isolation trenches 1902A are formed to a depth 1904A of between about 5000 Angstroms and 20,000 Angstroms and isolation trenches 1902B are formed to a depth 1904B between about 2500 Angstroms and about 3000 Angstroms.

Referring now to block 208 of FIG. 2A and to FIG. 20, a first liner layer 602 is formed in isolation trenches 1902A and 1902B. The first liner layer 602 may be substantially similar to first liner layer 602 of FIG. 6 and may be characteristic of a thick liner layer. In an exemplary embodiment, first layer liner 602 is formed to a thickness greater than or equal to about 100 Angstroms.

Referring now to block 210 of FIG. 2A and to FIG. 21, a first photoresist coating 702 substantially similar to photoresist coating 702 of FIG. 7 is applied over the substrate following the formation of the first liner layer 602. Referring now block 212 of FIG. 2A and to FIG. 22, the first photoresist coating 702 is patterned. In the illustrated embodiment, the patterning of the photoresist coating 702 exposes isolation trenches 1902A of the sensor region 302 while protecting isolation trenches 1902B of the circuit region 304.

Referring now to block 214 of FIG. 2A and to FIG. 23, the first liner layer 602 is selectively removed from the isolation trenches 1902A within the sensor region 302. After the first liner layer 602 is removed, the first photoresist coating 702 may be stripped.

Referring to block 216 of FIG. 2B and to FIG. 24, a second liner layer 1002 substantially similar to liner layer 1002 of FIG. 10 is formed in the isolation trenches 1902A of the sensor region 302. Forming the first liner layer 602 and the second liner layer 1002 independently allows the formation of a second liner layer 1002 with different physical characteristics than the first liner layer 602. For example, the second liner layer 1002 may be characteristic of a thin liner layer, and in that regard, may be formed to a thickness of less than or equal to about 100 Angstroms. In various exemplary embodiments, the second liner layer 102 ranges in thickness from about 1 Angstrom to about 100 Angstroms. In one such embodiment, the second liner layer 102 has a thickness of less than about 20 Angstroms.

Referring to block 218 of FIG. 2B and to FIG. 25, a second photoresist coating 1102 is applied over the substrate following the formation of the second liner layer 1002. Referring to block 220 of FIG. 2B and to FIG. 26, the second photoresist coating 1102 is patterned. In the illustrated embodiment, the patterning of the second photoresist coating 1102 exposes isolation trenches 1902A of the sensor region 302 while protecting isolation trenches 1902B of the circuit region 304.

Figure 27:
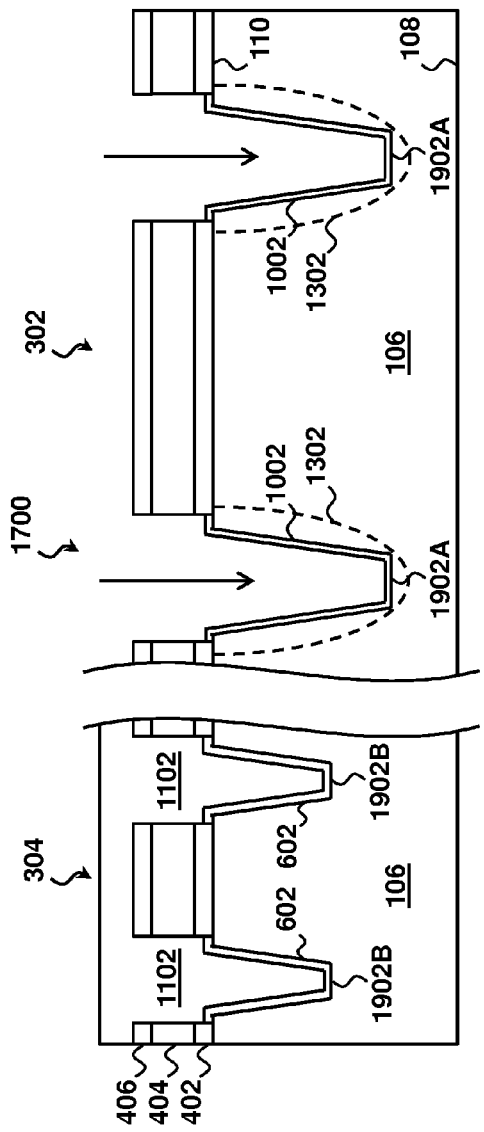

Referring to block 222 of FIG. 2B and to FIG. 27, an implantation is performed on the isolation trenches 1902A to form a junction isolation implantation region 1302 substantially similar to junction isolation implantation region 1302 of FIG. 13. The junction isolation implantation region 1302 inhibits the flow of charge carriers through the portion of the substrate 106 adjacent to the isolation structures. One advantage to forming disparate first 602 and second 1002 liner layers is that the second liner layer 1002 can be configured to promote formation of the junction isolation implantation region 1302. For example, a thinner second liner layer 1002 in isolation trench 1902A may allow for deeper and more uniform implantation with reduced implantation energy. Furthermore, the lower implantation field energy associated with a thinner liner can reduce the number of substrate defects formed by implantation. Thus, by these mechanisms and others, the second liner layer 1002 can be configured to provide a more effective isolation structure.

In some embodiments, the second liner layer 1002 produced by method 200 allows the use of plasma implantation to form the junction isolation implantation region 1302. Plasma implantation produces fewer defects that undermine insulation feature effectiveness than traditional implantation. However, plasma doping ions may not penetrate thicker liner layers. Thus in some embodiments, a liner layer 1002 of less than about 100 Angstroms allows the use of plasma implantation whereas a liner layer 1002 of greater than about 100 Angstroms does not. After the implantation of block 218, the second photoresist coating 1102 may be stripped.

Figure 28:
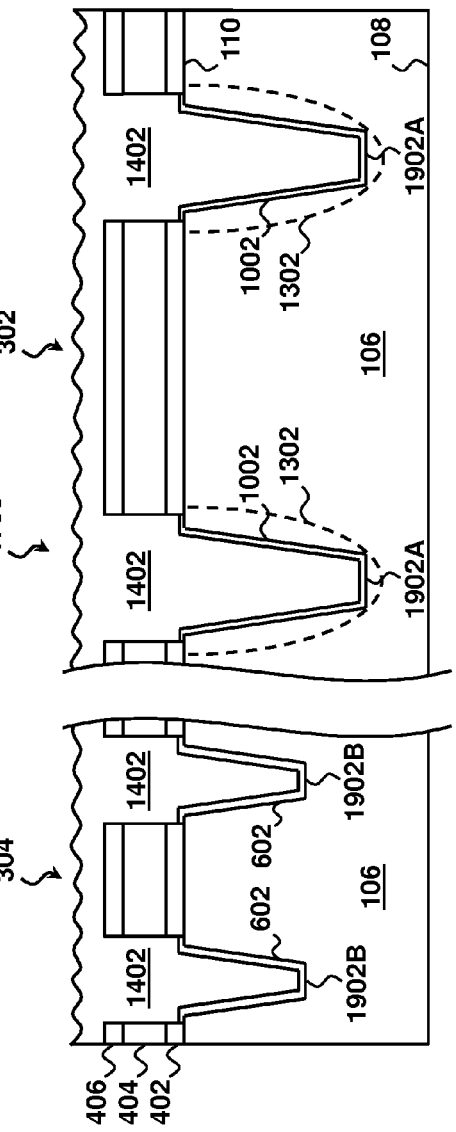

Referring to block 224 of FIG. 2B and to FIG. 28, a trench fill material 1402 is deposited in isolation trenches 1902A and 1902B. The trench fill material 1402 may be substantially similar to trench fill material 1402 of FIG. 14. Referring to block 226 of FIG. 2B and to FIG. 29, a portion of the trench fill material 1402 is removed via a mechanical process such as chemical mechanical polishing (CMP). The CMP process may also remove one or more additional layers such as the second dielectric layer 406.

Referring to block 228 of FIG. 2B and to FIG. 30, remaining processes in the formation of the integrated circuit 1700 are performed. This may include the formation of a light-sensing region 114, a pinned layer 116, a doped layer 118, source/drain regions 123, gate structures 124, a MLI 126, an anti-reflective layer 134, a color filter 136, and/or a lens 136, each substantially similar to those disclosed with reference to FIG. 1. It is understood that some of the elements of the integrated circuit 1700 may be formed by conventional processing, and thus some processes are not described in detail herein.

Thus, the present disclosure provides an integrated circuit device incorporating a plurality of isolation trench structures configured for disparate applications and a method of forming the integrated circuit. In some embodiments, a method of forming an integrated circuit comprises: receiving a substrate, the substrate having a first region and a second region; forming a first isolation trench in the first region; forming a second isolation trench in the second region; forming a first liner layer in the first isolation trench; forming a second liner layer in the second isolation trench, wherein the second liner layer has a physical characteristic that is different from a corresponding physical characteristic of the first liner layer; and performing an implantation procedure on the second isolation trench and the second liner layer formed therein. In one such embodiment, the physical characteristic of the second liner layer is selected to improve one of an implantation depth and a uniformity of the performed implantation procedure compared to the corresponding physical characteristic of the first liner layer.

In further embodiments, a method of forming an integrated circuit device comprises: receiving a substrate having a front surface and a back surface, the substrate further having a sensor region and a circuit region defined thereupon; etching a circuit region isolation trench in the back surface of the substrate; etching a sensor region isolation trench in the back surface of the substrate; depositing a first liner layer within the circuit region isolation trench; depositing a second liner layer within the sensor region isolation trench, wherein the second liner layer is different from the first liner layer; and performing an implantation of the sensor region isolation trench after the depositing of the second liner layer. In one such embodiment, the performing of the implantation of the sensor region isolation trench includes performing a plasma doping procedure.

In yet further embodiments, an integrated circuit device comprises: a substrate having: a sensor element and a circuit element formed thereupon; a first isolation structure formed thereupon, wherein the first isolation structure includes a first liner layer and a first trench fill material, and wherein the first isolation structure is disposed adjacent to the circuit element; and a second isolation structure formed thereupon, wherein the second isolation structure includes a second liner layer and a second trench fill material, wherein the first isolation structure is disposed adjacent to the sensor element, and wherein the first liner layer is different from the second liner layer. In one such embodiment, the second isolation structure further includes a junction isolation implantation region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
   receiving a substrate, the substrate having a first region and a second region;
   forming a first isolation trench in the first region;
   forming a second isolation trench in the second region;
   forming a first liner layer in the first isolation trench;
   forming a second liner layer in the second isolation trench, wherein the second liner layer has a thickness that is different from a thickness of the first liner layer;
   patterning a resist layer to protect the first liner layer within the first isolation trench and to expose the second liner layer within the second isolation trench; and
   using the patterned resist layer, performing an implantation procedure on the second isolation trench and the second liner layer formed therein, wherein the implantation procedure dopes a portion of the substrate adjacent to the second isolation trench by implanting a dopant through the second liner layer.

2. The method of claim 1, wherein the thickness of the second liner layer is selected to improve one of an implantation depth and a uniformity of the performed implantation procedure compared to the thickness of the first liner layer.

3. The method of claim 1, wherein the performing of the implantation procedure includes performing a plasma doping procedure.

4. The method of claim 1, wherein the thickness of the second liner layer is less than the thickness of the first liner layer.

5. The method of claim 4, wherein the thickness of the first liner layer is greater than or equal to about 100 Angstroms, and wherein the thickness of the second liner layer is less than about 100 Angstroms.

6. The method of claim 1,
   wherein the forming of the first liner layer further forms the first liner layer within the second isolation trench,
   the method further comprising performing an etching process to remove the first liner layer from within the second isolation trench prior to the forming of the second liner layer.

7. The method of claim 1,
   wherein the forming of the first isolation trench forms the first isolation trench having a first profile,
   wherein the forming of the second isolation trench forms the second isolation trench having a second profile, and
   wherein the second profile is different from the first profile.

8. The method of claim 7, wherein the second profile has a depth that is less than a depth of the first profile.

9. A method of forming an integrated circuit device, the method comprising:
   receiving a substrate having a front surface and a back surface, the substrate further having a sensor region and a circuit region defined thereupon;
   etching a circuit region isolation trench in the back surface of the substrate;
   etching a sensor region isolation trench in the back surface of the substrate;
   depositing a first liner layer within the circuit region isolation trench;
   depositing a second liner layer within the sensor region isolation trench, wherein the second liner layer has a different thickness from the first liner layer;
   patterning a resist layer to protect the first liner layer disposed within the circuit region isolation trench and to expose the second liner layer disposed within the sensor region isolation trench; and
   performing an implantation of the sensor region isolation trench after the depositing of the second liner layer using the patterned resist layer, wherein the implantation introduces ions into the sensor region of the substrate through the second liner layer without introducing ions into the circuit region of the substrate.

10. The method of claim 9, wherein the performing of the implantation of the sensor region isolation trench includes performing a plasma doping procedure.

11. The method of claim 9, wherein the second liner layer has a thickness that is less than a thickness of the first liner layer.

12. The method of claim 11, wherein the thickness of the first liner layer is greater than or equal to about 100 Angstroms, and wherein the thickness of the second liner layer is less than about 100 Angstroms.

13. The method of claim 9,
   wherein the depositing of the first liner layer further deposits the first liner layer within the second isolation trench,
   the method further comprising removing the first liner layer from within the second isolation trench prior to the depositing of the second liner layer.

14. The method of claim 9,
   wherein the circuit region isolation trench extends from the back surface of the substrate to a first depth;
   wherein the sensor region isolation trench extends from the back surface of the substrate to a second depth; and
   wherein the first depth and the second depth are different.

15. The method of claim 14, wherein the first depth is between about 2500 Angstroms and about 3000 Angstroms, and wherein the second depth is less than or equal to about 1500 Angstroms.

16. The method of claim 1, wherein the dopant includes boron.

17. A method of making an integrated circuit device comprising:
receiving a substrate:
forming a sensor element and a circuit element on the substrate;
forming a first isolation structure on the substrate, wherein the first isolation structure includes a first liner layer and a first trench fill material, and wherein the first isolation structure is disposed adjacent to the circuit element; and
forming a second isolation structure on the substrate,
wherein the second isolation structure includes a second liner layer and a second trench fill material,
wherein the forming of the second isolation structure includes:
forming a resist layer protecting the first trench fill material, and
doping a portion of the substrate adjacent the second liner layer by introducing a dopant through the second liner layer,
wherein the first trench fill material is protected by the resist layer during the doping,
wherein the second isolation structure is disposed adjacent to the sensor element, and
wherein the first liner layer has a different thickness from the second liner layer.

18. The method of claim 17, wherein the second liner layer has a thickness that is less than a thickness of the first liner layer.

19. The method of claim 18 wherein the thickness of the second liner layer is less than about 100 Angstroms.

20. The method of claim 19, wherein the thickness of the first liner layer is greater than or equal to about 100 Angstroms.

* * * * *